(12) United States Patent
Yang

(10) Patent No.: US 7,951,638 B1
(45) Date of Patent: May 31, 2011

(54) METHOD FOR MAKING A TEXTURED SURFACE ON A SOLAR CELL

(75) Inventor: Tsun Neng Yang, Taoyuan County (TW)

(73) Assignee: Atomic Energy Council-Institute of Nuclear Research, Taoyuan County (TW)

(*) Notice: Subject to any disclaimer, the term of this patent is extended or adjusted under 35 U.S.C. 154(b) by 30 days.

(21) Appl. No.: 12/683,957

(22) Filed: Jan. 7, 2010

(51) Int. Cl.
*H01L 31/18* (2006.01)

(52) U.S. Cl. ....... 438/63; 438/71; 257/E31.13; 136/250; 136/256

(58) Field of Classification Search ............... 438/63, 438/71; 257/E31.13; 136/250, 256
See application file for complete search history.

(56) References Cited

U.S. PATENT DOCUMENTS

| | | | | |
|---|---|---|---|---|
| 5,607,876 | A * | 3/1997 | Biegelsen et al. | 438/45 |
| 6,420,647 | B1 * | 7/2002 | Ji et al. | 136/259 |
| 6,544,870 | B2 * | 4/2003 | Park et al. | 438/507 |
| 7,691,731 | B2 * | 4/2010 | Bet et al. | 438/479 |
| 7,754,508 | B2 * | 7/2010 | Lee et al. | 438/29 |
| 7,754,600 | B2 * | 7/2010 | Kobayashi et al. | 438/630 |
| 7,838,876 | B2 * | 11/2010 | von Malm | 257/43 |
| 2006/0219287 | A1 * | 10/2006 | Huang | 136/243 |
| 2007/0056627 | A1 * | 3/2007 | Yang et al. | 136/263 |
| 2008/0276990 | A1 * | 11/2008 | Zhou et al. | 136/261 |
| 2009/0188557 | A1 * | 7/2009 | Wang et al. | 136/256 |
| 2009/0217967 | A1 * | 9/2009 | Hovel et al. | 136/249 |
| 2009/0255580 | A1 * | 10/2009 | Dasgupta et al. | 136/256 |
| 2010/0006148 | A1 * | 1/2010 | Zheng et al. | 136/256 |
| 2010/0224244 | A1 * | 9/2010 | Furusawa | 136/256 |
| 2010/0294334 | A1 * | 11/2010 | Luque Lopez et al. | 136/244 |

FOREIGN PATENT DOCUMENTS

| | | | |
|---|---|---|---|
| CN | 101692464 | * | 4/2010 |
| EP | 2 105 968 A1 | * | 9/2009 |

* cited by examiner

*Primary Examiner* — Mary Wilczewski
(74) *Attorney, Agent, or Firm* — Jackson IPG PLLC; Demian K. Jackson

(57) ABSTRACT

A method is disclosed for making a textured surface on a solar cell. At first, there is provided a solar cell with a P-type layer and an N-type layer. Then, a silicon quantum dot-silicon nitride film is provided on the solar cell by chemical vapor deposition. Then, the silicon quantum dot-silicon nitride film is etched. In a first phase, the etching of the silicon nitride is faster than that of the silicon quantum dots so that the silicon quantum dots are exposed, thus forming a transient textured surface on the silicon quantum dot-silicon nitride film. In a second phase, the etching of the silicon nitride is slower than that of the silicon quantum dots so that some of the silicon quantum dots are removed, thus leaving cavities in the silicon quantum dot-silicon nitride film, i.e., forming a final textured surface on the silicon quantum dot-silicon nitride film.

4 Claims, 8 Drawing Sheets

METHOD FOR MAKING A TEXTURED SURFACE ON A SOLAR CELL

FIELD OF INVENTION

The present invention relates to a method for making a textured surface on a solar cell and, more particularly, to a method for making a textured surface on a solar cell by providing a solar cell, providing a silicon quantum dot-silicon nitride film on the solar cell and etching the silicon quantum dot-silicon nitride film.

BACKGROUND OF INVENTION

There are four conventional ways for making a textured surface on a solar cell. In a chemical method, a chemical solution is used to etch a smooth surface of a semiconductor device into a textured surface. In a mechanical method, a machine is used to scratch a smooth surface of a semiconductor device into a textured surface. In a laser method, laser is used to cut a smooth surface of a semiconductor device into a textured surface. In an ion bombard method, ion beams are used to bombard a smooth surface of a semiconductor device into a textured surface.

Referring to FIGS. 6 to 8, in the chemical method, there is provided a P-type silicon chip 50 including a smooth front surface 50a and a smooth rear surface 50b. An HF solution or KOH solution is used to etch the smooth front surface 50a into a textured surface 50c to reduce the reflection of sunlit. A tubing furnace diffusion method, screen printing method, spin coating method or jet printing method is executed to dose N-type impurities such as phosphor or arsenic into the textured surface 50c of the P-type silicon chip 59, thus forming an N-type impurity diffusion region 51a. Finally, an evaporation method or chemical vapor deposition method is used to form an ARC 52 of titanium oxide, tantalum oxide or silicon nitride on the textured surface 50c of the P-type silicon chip 50. This chemical method is however long and expensive for having to forming the impurity diffusion region 51 and the ARC 52 after the forming of the textured surface 50c. Moreover, the efficiency of the conversion of solar energy into electricity with the resultant silicon solar cell is low.

The present invention is therefore intended to obviate or at least alleviate the problems encountered in prior art.

SUMMARY OF INVENTION

It is an objective of the present invention to provide an inexpensive method for making a textured surface on a solar cell.

It is another objective of the present invention to provide a textured surface on an efficient solar cell.

To achieve the foregoing objective, there is provided a solar cell with a P-type layer and an N-type layer. Then, a silicon quantum dot-silicon nitride film is provided on the solar cell by chemical vapor deposition. Then, the silicon quantum dot-silicon nitride film is etched. In a first phase, the etching of the silicon nitride is faster than that of the silicon quantum dots so that the silicon quantum dots are exposed, thus forming a transient textured surface on the silicon quantum dot-silicon nitride film. In a second phase, the etching of the silicon nitride is slower than that of the silicon quantum dots so that some of the silicon quantum dots are removed, thus leaving cavities in the silicon quantum dot-silicon nitride film, i.e., forming a final textured surface on the silicon quantum dot-silicon nitride film.

Other objectives, advantages and features of the present invention will become apparent from the following description referring to the attached drawings.

BRIEF DESCRIPTION OF DRAWINGS

The present invention will be described via the detailed illustration of the preferred embodiment referring to the drawings.

DETAILED DESCRIPTION OF PREFERRED EMBODIMENT

Figure 1:
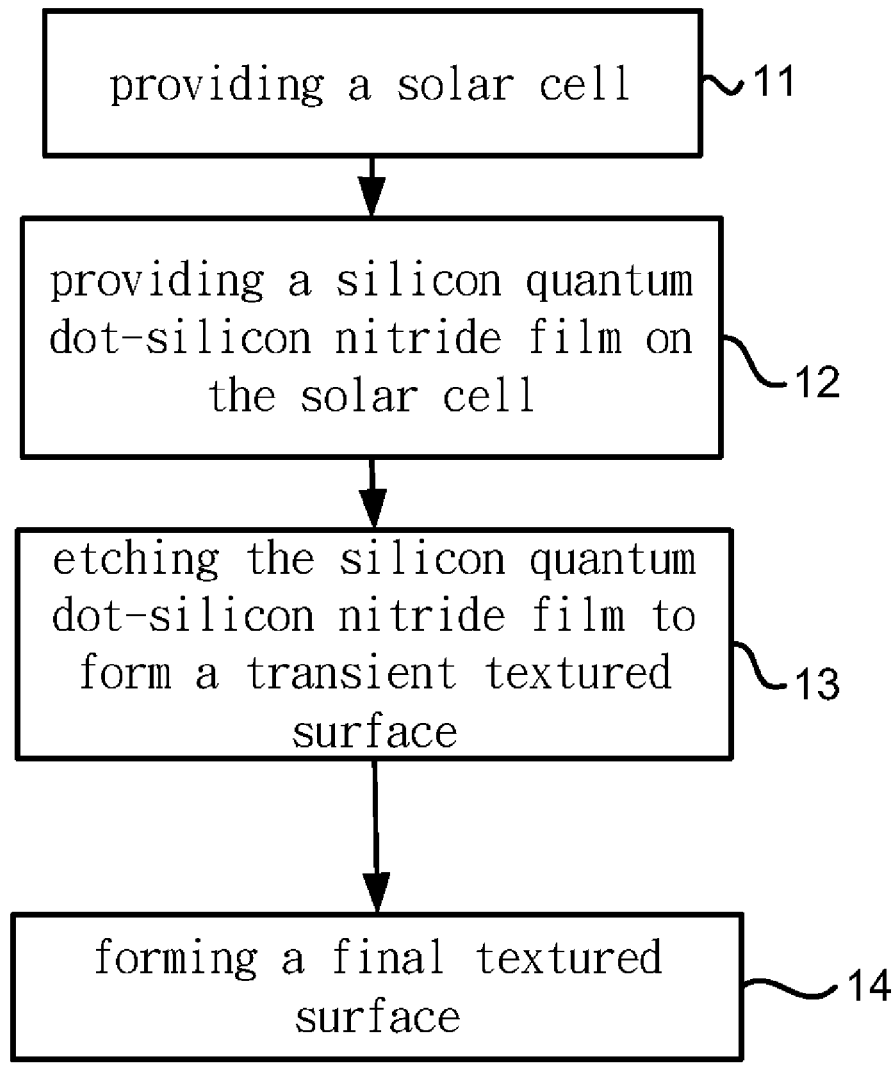
FIG. 1 is a flow chart of a method for making a textured surface on a solar cell according to the preferred embodiment of the present invention.

Referring to FIG. 1, there is shown a method for making a textured surface on a solar cell according to the preferred embodiment of the present invention.

Figure 2:
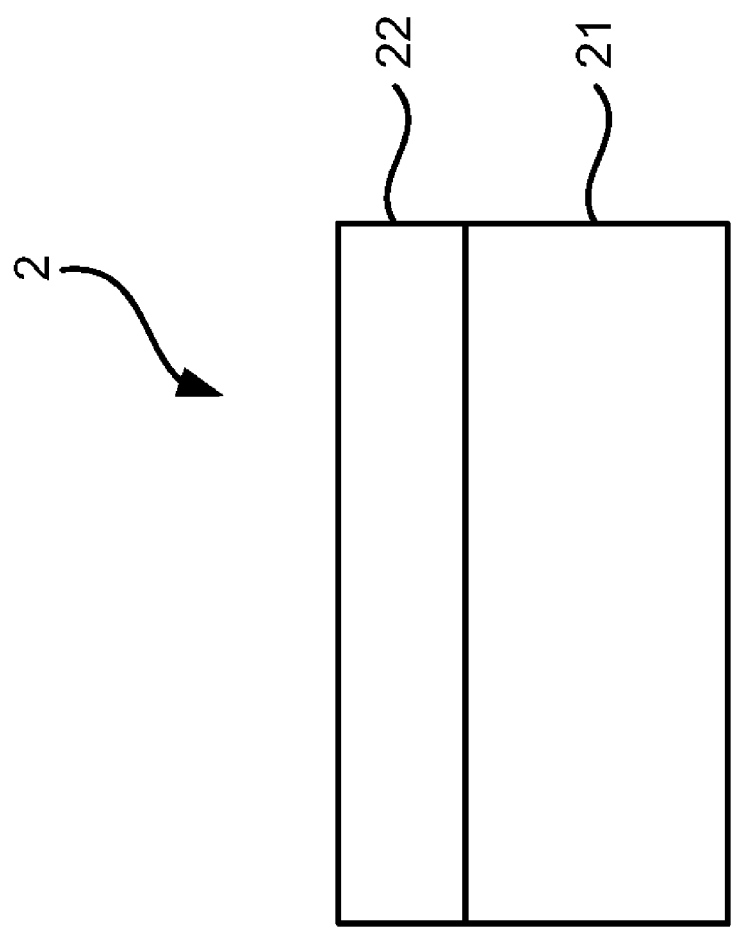
FIG. 2 is a cross-sectional view of a solar cell processed in the method shown in FIG. 1.

Referring to FIGS. 1 and 2, at 11, there is provided a solar cell 2 including a P-type layer 21 and an N-type layer 22. The solar cell 2 may be a single junction or multi junction structure. The solar cell 2 may be made of silicon, a III-V compound or a II-VI compound.

Figure 3:
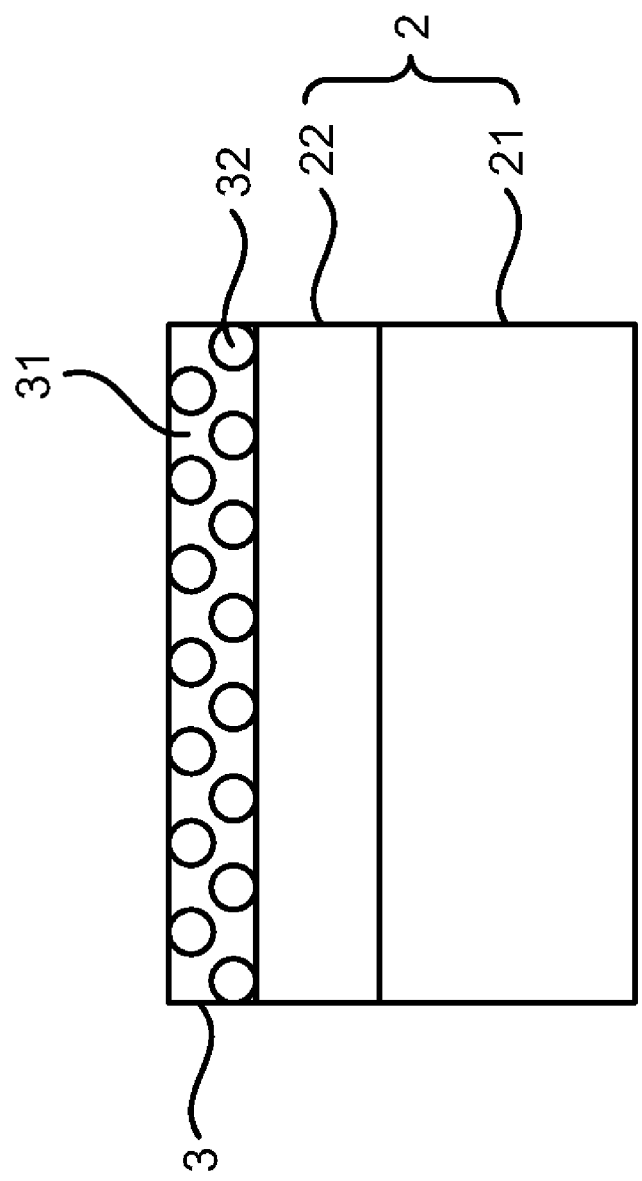
FIG. 3 is a cross-sectional view of a silicon quantum dot-silicon nitride layer on the solar cell shown in FIG. 2.

Referring to FIGS. 1 and 3, at 12, a silicon quantum dot-silicon nitride film 3 is provided on the solar cell 2. The silicon quantum dot-silicon nitride film 3 is provided on the N-type layer 22 of the solar cell 2 in a plasma-enhanced chemical vapor deposition ("PECVD") method, electron cyclotron resonance chemical vapor deposition ("ECR-CVD") method, very high frequency chemical vapor deposition ("VHF-CVD") method or hot wire chemical vapor deposition ("HWCVD") method. The silicon quantum dot-silicon nitride film 3 includes silicon quantum dots 32 embedded in silicon nitride 31.

Figure 4:
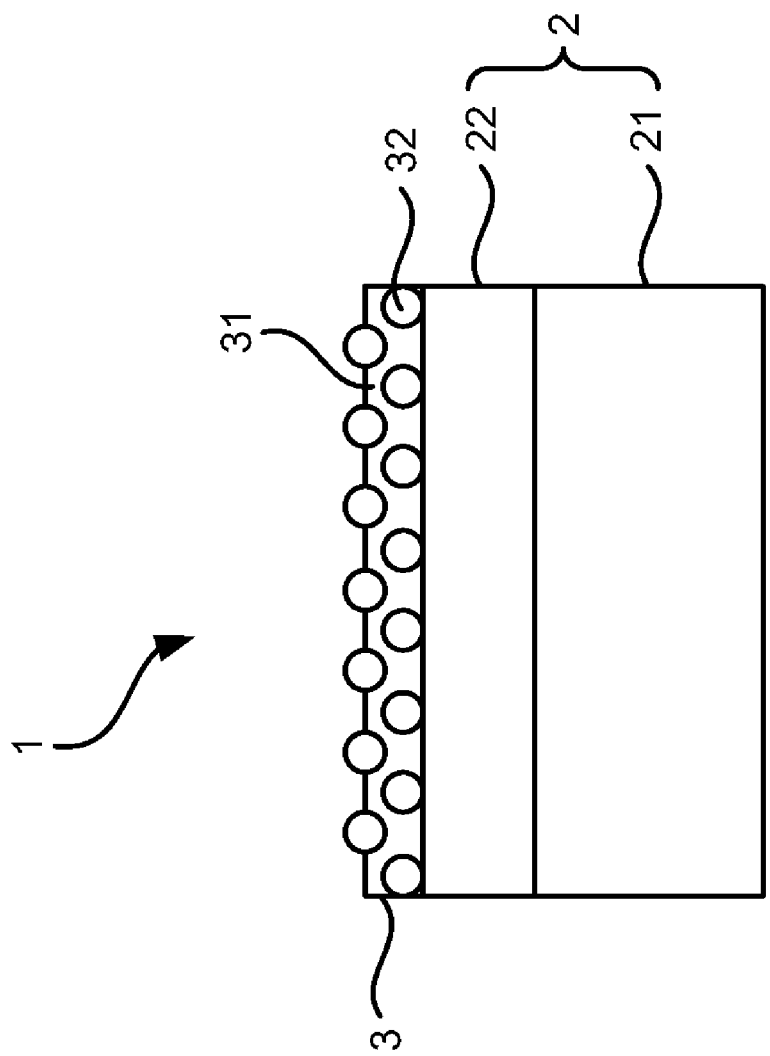
FIG. 4 is a cross-sectional view of the laminate shown in FIG. 3 after a first phase of etching in the method shown in FIG. 1.

Referring to FIGS. 1 and 4, at 13, the silicon quantum dot-silicon nitride film 3 is etched in a first phase. The silicon quantum dot-silicon nitride film 3 is etched in a chemical or physical method. The etching of the silicon nitride 31 is faster than that of the silicon quantum dots 32, the silicon quantum dots 32 are exposed, thus forming a transient textured surface 1 on the silicon quantum dot-silicon nitride film 3.

Figure 5:
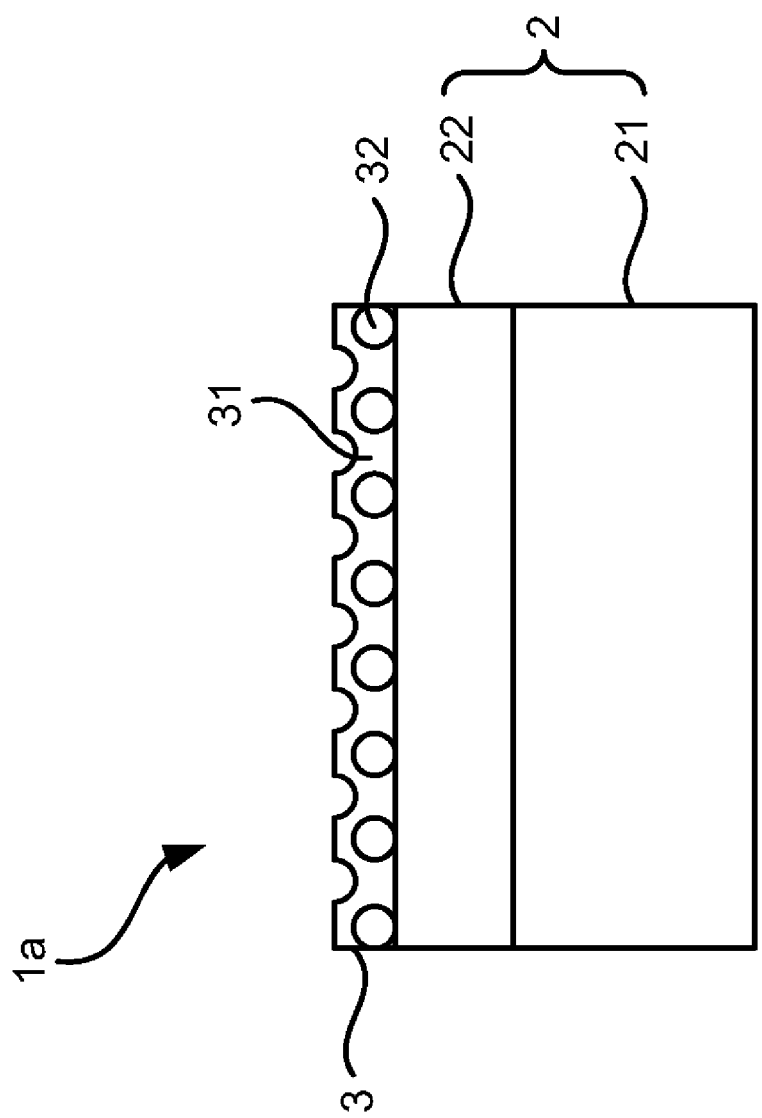
FIG. 5 is a cross-sectional view of the laminate shown in FIG. 3 after a second phase of etching in the method shown in FIG. 1.
Figure 6:
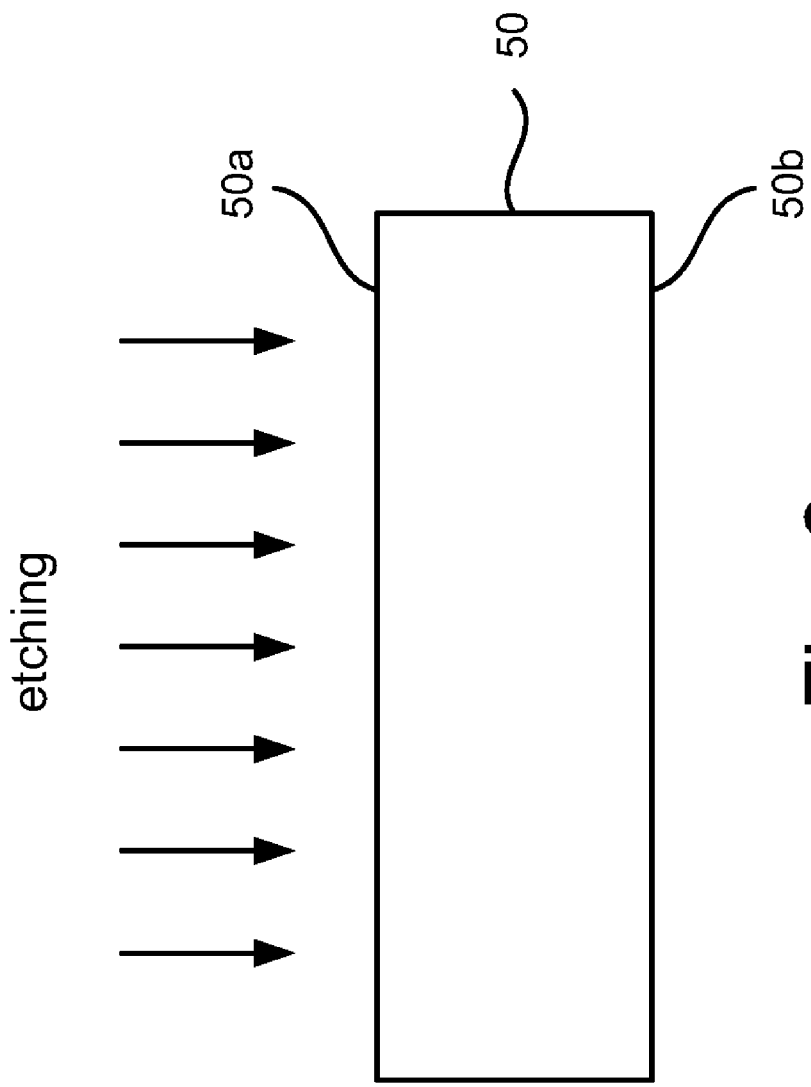
FIG. 6 is a cross-sectional view of a P-type silicon chip processed in a conventional chemical method.
Figure 7:
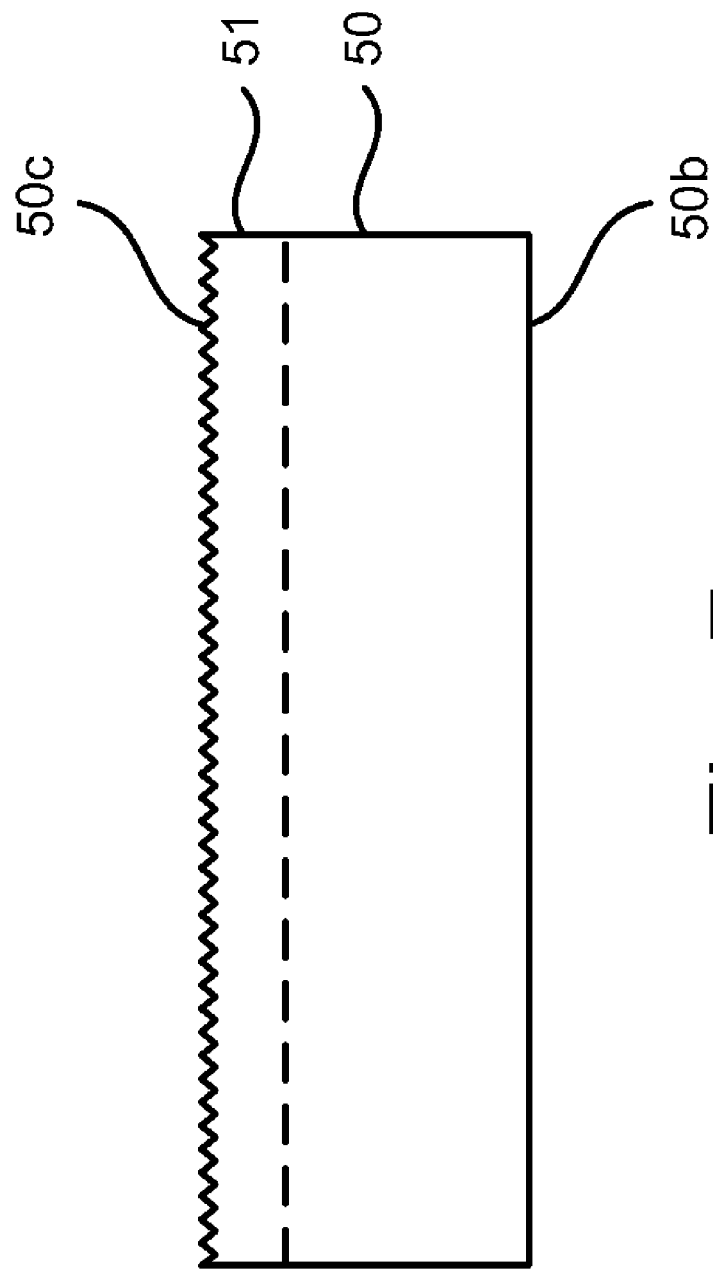
FIG. 7 is a cross-sectional view of the P-type silicon chip shown in FIG. 6 after the forming of a textured surface and the dosing of N-type impurities.
Figure 8:
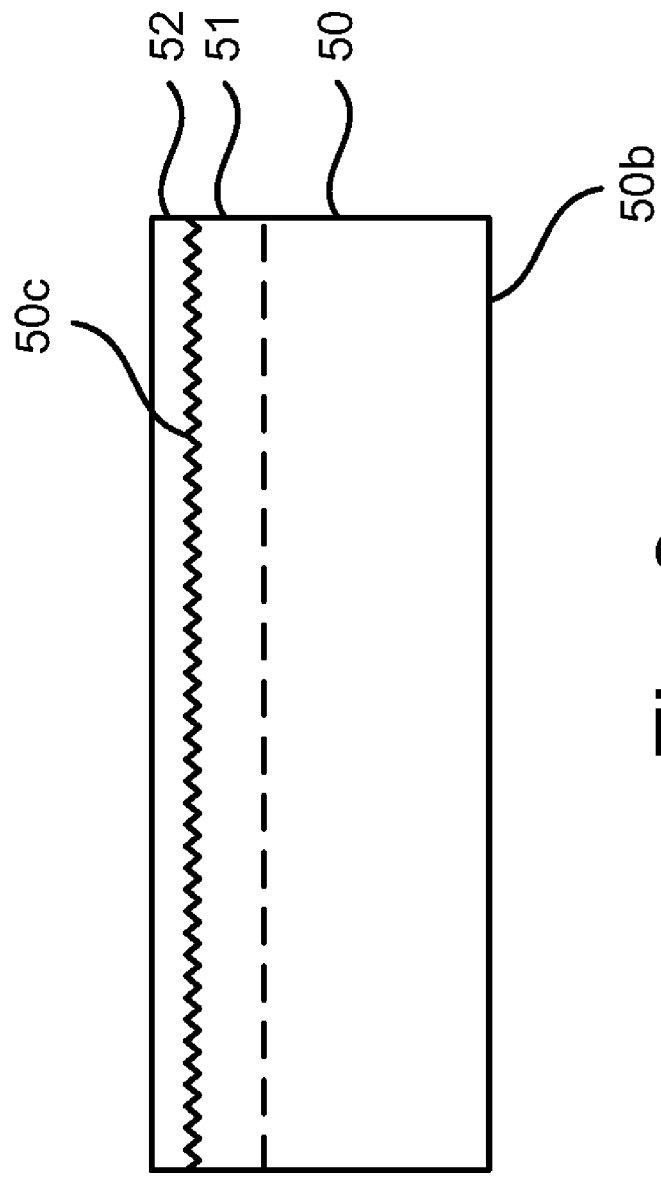
FIG. 8 is a cross-sectional view of the P-type silicon chip shown in FIG. 7 after the forming of an ARC.

Referring to FIGS. 1 and 5, at 14, the silicon quantum dot-silicon nitride film 3 is etched in a second phase. The chemical or physical etching of the silicon quantum dot-silicon nitride film 3 continues. The etching of the silicon nitride 31 is slower than that of the silicon quantum dots 32, some of the silicon quantum dots 32 are removed, thus leaving cavities in the silicon quantum dot-silicon nitride film 3, i.e., forming a final textured surface 1a on the silicon quantum dot-silicon nitride film 3.

As discussed above, the method is short and inexpensive. The resultant solar cell 2 is provided with the silicon quantum dot-silicon nitride film 3 formed with the textured surface 1a. The silicon quantum dot-silicon nitride film 3 formed with the textured surface 1a is used as an effective ARC so that the absorption of sunlit is good. Moreover, the efficiency of the conversion of solar energy into electricity with the solar cell 2 is high.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A method for making a textured surface on a solar cell comprising the steps of:
    providing a solar cell with a P-type layer and an N-type layer;
    providing a silicon quantum dot-silicon nitride film on the solar cell by chemical vapor deposition;
    etching the silicon quantum dot-silicon nitride film in a first phase where the etching of the silicon nitride is faster than that of the silicon quantum dots so that the silicon quantum dots are exposed, thus forming a transient textured surface on the silicon quantum dot-silicon nitride film; and
    etching the silicon quantum dot-silicon nitride film in a second phase where the etching of the silicon nitride is slower than that of the silicon quantum dots so that some of the silicon quantum dots are removed, thus leaving cavities in the silicon quantum dot-silicon nitride film, i.e., forming a final textured surface on the silicon quantum dot-silicon nitride film.

2. The method according to claim 1, wherein the solar cell is selected from a group consisting of a single-junction structure and a multi-junction structure.

3. The method according to claim 1, wherein the solar cell is made of material selected from a group consisting of silicon, III-V compounds and II-VI compounds.

4. The method according to claim 1, wherein the chemical vapor deposition is selected from a group consisting of plasma-enhanced chemical vapor deposition, electron cyclotron resonance chemical vapor deposition, very high frequency chemical vapor deposition and hot wire chemical vapor deposition.

* * * * *